United States Patent [19]

Flora et al.

[11] 4,331,951
[45] May 25, 1982

[54] BCD-TO-BINARY CONVERTER

[75] Inventors: Laurence P. Flora, Covina; Daniel P. Wiener, Glendale, both of Calif.

[73] Assignee: Burroughs Corporation, Detroit, Mich.

[21] Appl. No.: 168,828

[22] Filed: Jul. 10, 1980

Related U.S. Application Data

[63] Continuation of Ser. No. 732, Jan. 3, 1979, abandoned.

[51] Int. Cl.³ .......................................... H03K 13/24
[52] U.S. Cl. ............................................ 340/347 DD
[58] Field of Search ............... 340/347 DD; 235/311; 364/783

[56] References Cited

U.S. PATENT DOCUMENTS 3,064,894 11/1962 Campbell .................... 340/347 DD
3,449,555 6/1969 Anwang ..................... 340/347 DD
3,882,483 5/1975 Burke ........................ 340/347 DD

FOREIGN PATENT DOCUMENTS 947143 1/1964 United Kingdom ............... 364/783

OTHER PUBLICATIONS

Camp "IBM Technical Disclosure Bulletin" vol. 2, No. 6, Apr. 1960, p. 46.
Linford "Computer Design" Sep. 1970, pp. 53–61.
Beougher "Computer Design" Mar. 1973, pp. 53–59.

*Primary Examiner*—Charles D. Miller
*Attorney, Agent, or Firm*—Nathan Cass; Kevin R. Peterson; David G. Rasmussen

[57] ABSTRACT

A BCD-to-binary converter employing a plurality of levels of logical circuitry which provides for the addition of BCD bits based on a powers of 2 expansion of each BCD digit. At least one level of logic circuitry comprises a PROM arrangement in which each PROM is of sufficient size to prevent a carry from being generated therefrom taking into account that a BCD digit cannot exceed a value of 9. Also, at least one PROM is provided with the capability of adding a greater number of BCD bits than the maximum PROM inputs available by proper choice of the particular BCD inputs applied thereto and the particular manner in which the PROM is programmed.

12 Claims, 5 Drawing Figures

TABLE I

| $b_{23}$ | $b_{22}$ | $b_{21}$ | $b_{20}$ | $b_{19}$ | $b_{18}$ | $b_{17}$ | $b_{16}$ | $b_{15}$ | $b_{14}$ | $b_{13}$ | $b_{12}$ | $b_{11}$ | $b_{10}$ | $b_9$ | $b_8$ | $b_7$ | $b_6$ | $b_5$ | $b_4$ | $b_3$ | $b_2$ | $b_1$ | $b_0$ |
|---|---|---|---|---|---|---|---|---|---|---|---|---|---|---|---|---|---|---|---|---|---|---|---|
| G8 | G8 | G8 | F8 | F8 | F8 | F4 | E8 | E4 | E2 | E8 | D8 | D8 | C8 | C8 | C4 | B8 | B4 | B8 | A8 | A4 | A2 | A1 | |
| | | G4 | G4 | G8 | F4 | F2 | F2 | F1 | G1 | E1 | E8 | D4 | D4 | D8 | C4 | C2 | C2 | C8 | B2 | B4 | B2 | B1 | |
| | | | G2 | G4 | G4 | G8 | F1 | G2 | | F8 | E4 | E8 | D2 | D4 | D8 | D4 | C1 | C1 | C4 | B1 | C1 | | |
| | | | | G2 | G2 | G2 | G4 | | | | F8 | E4 | E4 | D2 | D4 | D2 | D8 | D4 | D2 | C2 | | | |
| | | | | G1 | G1 | G1 | G1 | | | | F4 | E2 | E2 | D1 | D2 | D1 | D2 | D1 | E1 | D1 | | | |
| | | | | | | | | | | | G8 | F4 | E1 | E2 | D1 | E8 | D1 | E2 | | | | | |
| | | | | | | | | | | | | F2 | F8 | E1 | E1 | F4 | E4 | F1 | | | | | |
| | | | | | | | | | | | | G4 | F2 | F4 | F8 | F1 | F2 | | | | | | |
| | | | | | | | | | | | | | | F1 | F1 | F2 | G2 | G1 | | | | | |
| | | | | | | | | | | | | | | G2 | G8 | G4 | | | | | | | |
| | | | | | | | | | | | | | | | | G1 | | | | | | | |

BCD-TO-BINARY CONVERTER

This is a continuation of application Ser. No. 000,732, filed Jan. 3, 1979 now abandoned.

CROSS REFERENCE TO RELATED APPLICATION

The commonly assigned, concurrently filed Patent Application Ser. No. 000,729, filed Jan. 3, 1979, for Programmable Read-Only Memory Adder, inventors Laurence Paul Flora and Daniel Paul Wiener, is related to this application.

BACKGROUND OF THE INVENTION

This invention relates generally to means and methods for translating between different number systems used in a data processor. More particularly, the invention relates to improved means and methods for providing high speed conversion of binary coded decimal (BCD) numbers to binary form.

In the binary system of notation, each binary digit (bit) represents a different power of 2. The least significant bit represents $2^0$, the bit of next significance $2^1$, the bit of next significance $2^2$ and so on. For example, in straight binary notation, the number 11101 is equal to $1 \times 2^4 + 1 \times 2^3 + 1 \times 2^2 + 0 \times 2^1 + 1 \times 2^0 = 29$ in decimal notation.

In the binary coded decimal (BCD) system of notation, each group of 4 bits represents one decimal character. The same decimal number 29, as above, is represented in BCD notation by 0010 1001.

In automatic digital computers, it is frequently required to provide for converting BCD numbers to binary form. Various known approaches for providing such BCD-to-binary conversion are described and referenced in the article: "A Method for High Speed BCD-to-binary Conversion", L. C. Beougher, Computer Design, March 1973, pp. 53–59. This article is to be considered as incorporated herein.

In the above referenced Beougher article, an improved BCD-to-binary conversion approach is proposed. The design principle which is followed in the Beougher BCD-to-binary conversion approach is based on the addition of columns of BCD bits produced by a power of 2 expansion of each BCD digit. For example, decimal 89 in BCD notation is 1000 1001 which can be more completely expressed as $(1000)_2 (10)_{10} + (1001)_2 (1)_{10} = (1000)_2 (8+2)_{10} + (1001)_2 (1)_{10} = (1000)_2 (2^3 + 2^1)_{10} + (1001)_2 (2^0)_{10}$. As illustrated below, the equivalent binary value 1011001 of BCD number 89 is obtained in accordance with the final expression above (which represents the power of 2 expansion of the BCD number 89) by adding the columns of BCD bits obtained after multiplication by the proper power of 2 value(s) (note that multiplication by a power of 2 in binary arithmetic is accomplished by merely shifting the binary number to the left a number of places equal to the value of the exponent):

| | | |
|---|---|---|
| $(1001)_2 (2^0)_{10}$ = | 1001 = | 9 |
| $(1000)_2 (2^1)_{10}$ = | 10000 = | 16 |
| $(1000)_2 (2^3)_{10}$ = | 1000000 = | 64 |
| | 1011001 | 89 |

SUMMARY OF THE INVENTION

The present invention is directed to improvements in the above described Beougher BCD-to-binary conversion approach whereby the same powers of 2 expansion is employed as taught by Beougher. However, instead of using a complex tree structure of 4-bit binary adders and look-ahead carry generators for implementation purposes, as in the Beougher article, the present invention employs a novel arrangement of PROMs (programmable read-only memories) which takes unusual advantage of the Beougher approach so as to achieve reduced hardware requirements and significantly faster BCD-to-binary conversion.

The present invention also provides improved means and methods for performing addition using PROMs.

The specific nature of the invention as well as other objects, advantages and features thereof will become readily apparent from the following detailed description of a preferred embodiment taken in conjunction with the accompanying drawings.

BRIEF DESCRIPTION OF THE DRAWINGS

FIG. 2 is a table illustrating additions performed by the embodiment of FIG. 1 in implementing an illustrative BCD-to-binary conversion in accordance with the invention.

FIG. 4 is a schematic diagram illustrating a preferred embodiment of the second logic level 14 of FIG. 2.

FIG. 5 is a schematic and block diagram illustrating a preferred embodiment of the third logic level 16 of FIG. 1.

DETAILED DESCRIPTION

Like numerals refer to like elements throughout the figures of the drawings.

In order to permit the present invention to be clearly understood, a specific preferred embodiment of the invention will be considered for illustrative purposes wherein, for example, a 7-digit BCD number (which will be represented herein as GFEDCBA or more simply as G-A) is converted to a 24-bit binary number (which will be represented herein as $b_{23}$, $b_{22}$, $b_{21}$–$b_0$ or more simply as $b_{23}$–$b_0$). It is to be understood that A is the least significant digit of the BCD number while $b_0$ is the least significant bit of the binary number. Also, for identification purposes, each of the four bits of which a BCD digit is comprised will be represented by its respective letter followed by a "power of 2" number indicative of its order of significance. For example, BCD digit A is represented by the four binary bits A8, A4, A2 and A1, wherein A1 is the least significant bit.

As pointed out previously herein, the present invention takes advantage of the powers of 2 expansion approach described in the aforementioned Beougher article. Accordingly, using the Beougher powers of 2 expansion approach, Table I shown in FIG. 2 is derived representing the various columns of BCD bits which are required to be added for converting the 7-digit BCD number G-A being considered herein to its equivalent 24-bit binary number $b_{23}$–$b_0$. Specific details as to the manner in which Table I in FIG. 2 can be derived for use in BCD-to-binary conversion are contained in the aforementioned Beougher article. For the purposes of the present invention, which is directed to improved means and methods for implementing such a table, it is sufficient to understand that each of the binary digits $b_{23}$–$b_0$ of the desired BCD-to-binary conversion is obtained by adding the column of BCD bits appearing directly under the binary bit in Table I in FIG. 2, along with any carries generated from the additions of previous columns. For example, the binary digit $b_3$ is obtained by adding BCD bits A8, B4, B1, C2 and D1 along with any carries generated as a result of the additions of previous columns.

Figure 1:
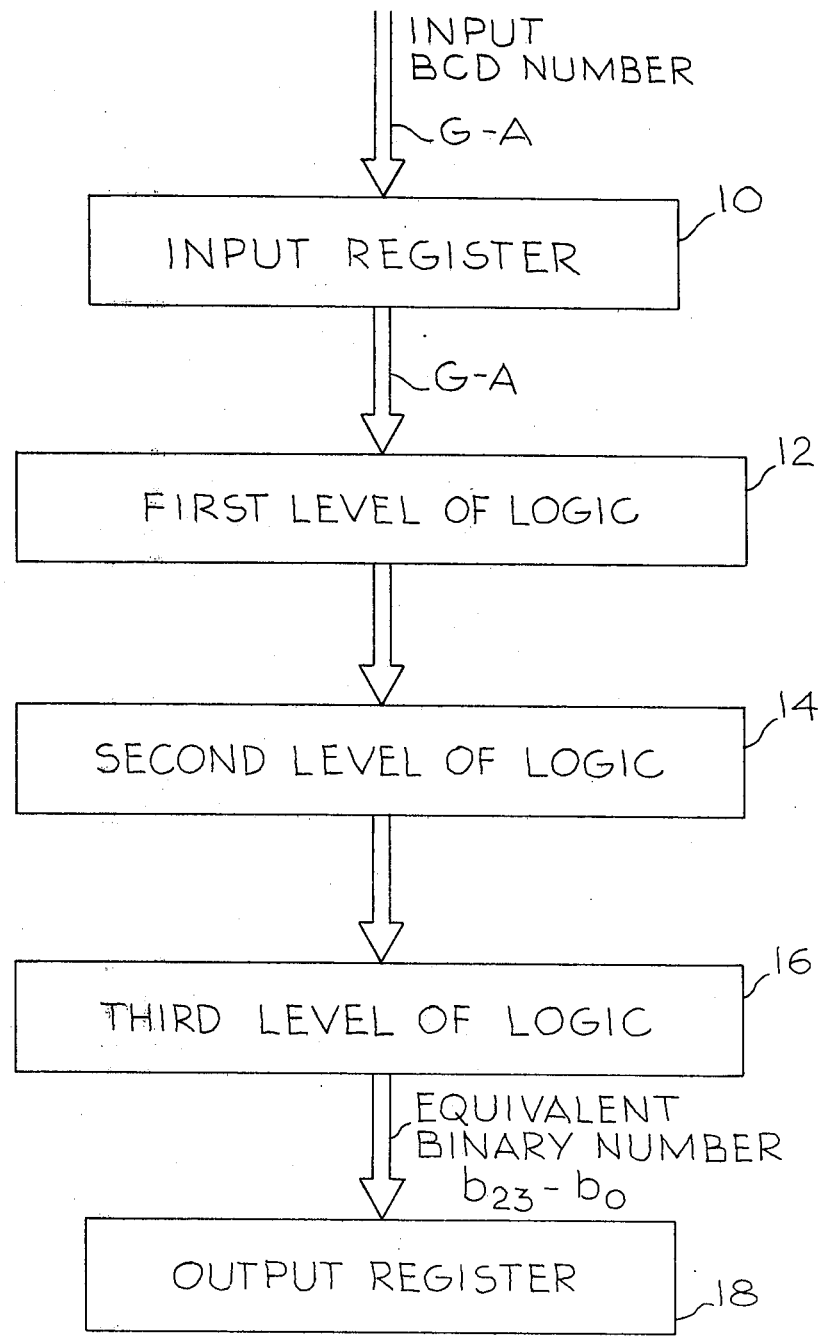
FIG. 1 is an overall block diagram of a preferred embodiment of a BCD-to-Binary Converter in accordance with the invention.

Referring now to FIG. 1, illustrated therein is an overall diagram of a preferred embodiment of the present invention for providing BCD-to-binary conversion of the illustrative 7-digit BCD number G-A to its equivalent binary number $b_{23}$–$b_0$ by performing the additions indicated in Table I of FIG. 2. As shown, the preferred embodiment illustrated in FIG. 1 comprises an input register 10 for receiving and storing the BCD number which is to be converted to binary form (which for illustrative purposes is assumed to be the 7-digit BCD number G-A); first and second levels of logic 12 and 14 which are each implemented using a specially chosen arrangement of PROMs as illustrated in FIG. 2; a third level of logic 16 employing conventional adding and carry generation techniques; and an output register 18 for receiving and storing the resulting 24-bit binary number $b_{23}$–$b_0$ provided at the output of the third level of logic 16. It is to be understood that, as is the case for the full adder implementation disclosed in the aforementioned Beougher article, the BCD-to-binary conversion provided by the preferred embodiment of FIG. 1 is preferably accomplished in a parallel manner without the need for a clock. It is also to be understood that the manner in which the present invention may provide for the conversion of decimal numbers having different numbers of BCD digits will become evident from the description of the BCD-to-binary conversion of the illustrative 7-digit BCD number provided herein.

At this point in the description it will be helpful to note that almost an infinite variety of logical arrangements are possible for arranging and implementing the logic levels 12, 14 and 16 in FIG. 1. In accordance with the present invention, the particular logic implementation employed for each level as well as the particular division of logic levels 12, 14 and 16 provided are specially chosen to take advantage of particular characteristics arising from the aforementioned Beougher approach as well as from particular characteristics of BCD-to-binary conversion.

An initial objective of the preferred embodiment of FIG. 1 is to provide for progressively reducing the relatively long columns of BCD bits which have to be added in accordance with Table I of FIG. 2 using the three logic levels 12, 14 and 16 illustrated. The first and second logic levels 12 and 14 are implemented in a particularly advantageous manner by employing special arrangements of individually programmed high speed PROMs in each of levels 12 and 14 which provides a significant reduction in the number of PROMs which would otherwise be required for this purpose. The resultant logic provided by levels 12 and 14 reduces the bits to be added in each column to no more than two bits per column. This permits each of the binary output bits $b_{23}$–$b_0$ of the equivalent binary number to then be readily provided by the third logic level 16 in FIG. 1 using conventional adding and carry generation techniques.

Figure 3:
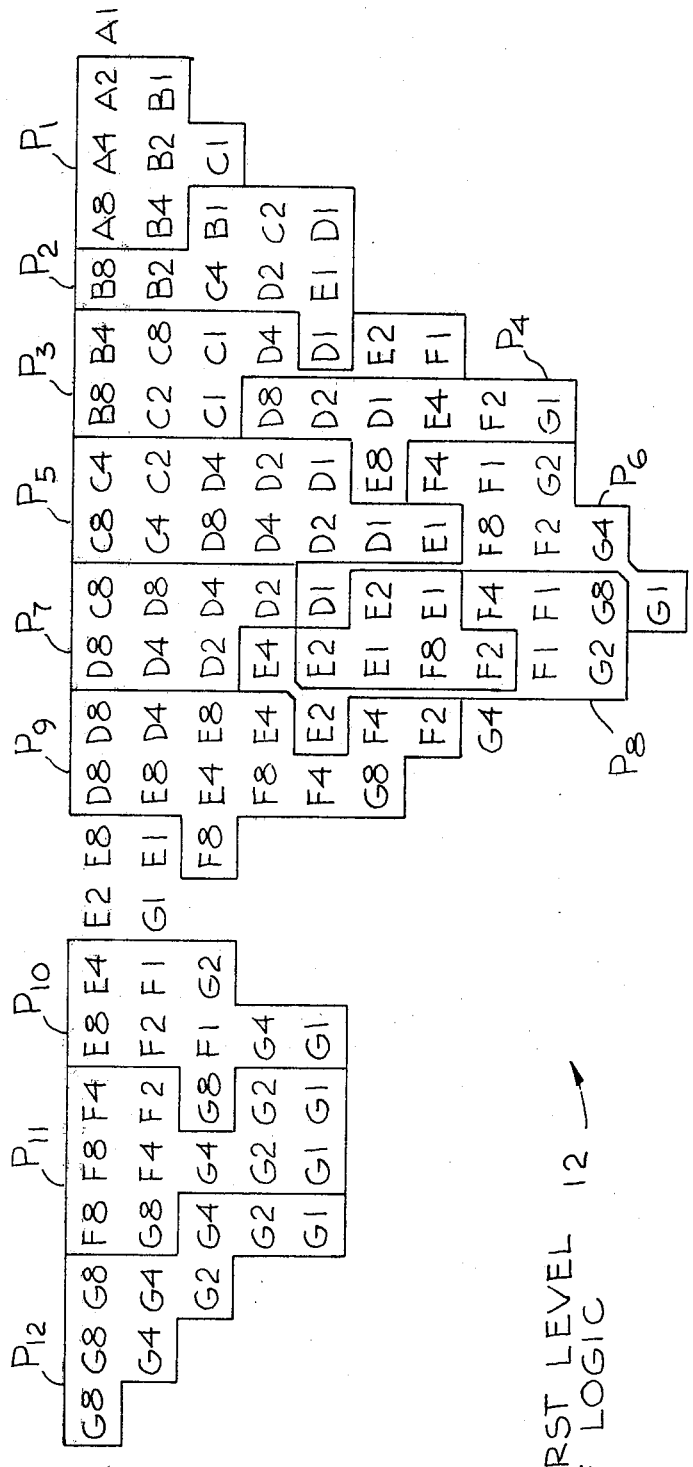
FIG. 3 is a schematic diagram illustrating a preferred embodiment of the first logic level 12 of FIG. 1.

Reference is now directed to FIG. 3 which schematically illustrates a preferred embodiment for the first logic level 12 of FIG. 1. It should be noted that Table I in FIG. 2 is directly transposed to FIG. 3 for use in illustrating the specially chosen PROM arrangement employed for the first logic level 12. This is done in order to provide for convenient identification of the particular BCD bits and their respective column positions which are to be added by each of the 12 PROMs $P_1$–$P_{12}$ provided for the first logic level 12. More specifically, it will be understood that the particular columns of BCD bits to be added by each of the PROMs $P_1$–$P_{12}$ of the first logic level 12 shown in FIG. 3 are those columns containing the particular BCD bits enclosed within the boundary line which represents each PROM. For example, PROM $P_1$ provides for the addition of the columns constituted by BCD bits A2, A4, A8, B1, B2, B4 and C1, wherein BCD bits A2 and B1 are in the $b_1$ column of the table, BCD bits A4, B2 and C1 are in the $b_2$ column of the table, and BCD bits A8 and B4 are in the $b_3$ column of the table.

At this point in the description, it will be appropriate to consider how the PROM arrangement shown for the first logic level 12 in FIG. 3 is specially chosen in accordance with the invention. Obviously, many different types of PROM arrangements are possible, since, not only are the sizes and programming of the PROMs variable, but also the particular combinations of inputs which are chosen to be applied to the PROM are also variable. It will be understood that one direct approach to providing a PROM implementation would be to arrange the PROMs so as to provide for straightforward addition of each of the columns in Table I of FIG. 2. This is not done in accordance with the present invention. Instead, and as mentioned previously herein, the present invention takes advantage of particular characteristics of the aforementioned Beougher approach and BCD-to-binary conversion so as to provide a highly advantageous overall implementation. In particular, advantageous use of these characteristics is taken with regard to the choice of the specific PROM arrangement employed for the first logic level 12 in FIG. 3, as will now be considered in detail.

It will be noted in Table I in FIG. 2 (derived from the Beougher approach) that certain BCD bits appear in a plurality of columns in the table. For example, note that C1 appears in columns $b_2$, $b_5$ and $b_6$, while D1 appears in columns $b_3$, $b_5$, $b_6$, $b_7$, $b_8$ and $b_9$. As will shortly be considered in further detail, the present invention takes advantage of the presence of these duplicate bits in Table I in a manner such that a PROM is able to provide for the addition of columns containing a greater number of input BCD bits than would otherwise be possible based on the PROM's actual input capability.

Another characteristic of which advantage is taken in choosing the PROM arrangement for the first logic level 12 in FIG. 3 is derived from the fact that the value of a BCD digit cannot exceed 9. Thus, certain BCD bit value combinations in Table I corresponding to BCD digits greater than 9 cannot occur. The specific manner in which this characteristic is also used to advantage in choosing the PROM arrangement of the first logic level 12 of FIG. 2 will likewise be considered in further detail shortly.

A further characteristic of which advantage is taken in choosing the PROM arrangement for the first logic level 12 in FIG. 3 is based on the choice of the BCD inputs to each PROM so that the resultant output from each PROM does not produce a carry. This provides the advantage that no carries need be propagated or accounted for between PROMs in the first logic level 12 nor be of concern to the second logic level 14.

The characteristics summarized above and their application to the preferred embodiment of the present invention will now be considered in further detail with particular reference to the arrangement of PROMs $P_1$–$P_{12}$ illustrated for the first logic level 12 in FIG. 3. Each of PROMs $P_1$–$P_{12}$ may typically be implemented as a 256×4 bit PROM using, for example, a Fairchild 93427 integrated circuit chip. Such a 256×4 bit PROM provides a maximum of 8 inputs and 4 outputs. PROM $P_5$ in the first logic level 12 in FIG. 3 provides a good example of how the presence of duplicate BCD bits occurring in Table I of FIG. 2 can be used to advantage in accordance with the invention to permit a PROM to provide for the addition of columns from Table I containing significantly more input BCD bits than the maximum number of inputs available. It will be noted in FIG. 3 that two columns containing 12 input BCD bits are provided for addition by PROM $P_5$, even though only 8 inputs are available for a 256×4-bit PROM. This is accomplished for PROM $P_5$ by the judicious choice of these 12 BCD bit inputs from Table I such that the following requirements are met: (1) no more than 8 of these 12 input BCD bits are unique, these being the 8 input BCD bits C2, C4, C8, D1, D2, D4, D8 and E1 (the remaining 4 input BCD bits C4, D1, D2 and D4 being duplicates); and (2) the sum of these 12 chosen input BCD bits is never greater than 15 or 1111 so as to thereby prevent production of a carry from the PROM.

The achievement of requirement (2) above is aided by the fact that the value of a BCD digit cannot exceed 9. For example, note with regard to PROM $P_5$ that if all of the 12 BCD bit inputs could simultaneously have a binary 1 value, then the sum would be 19 or 10011, in which case requirement (2) would not be met since a carry would be produced from the PROM. However, because it is known that the 12 inputs to PROM $P_5$ are BCD bits (whose corresponding BCD digits cannot be greater than (9), it is never possible for both of the two most significant bits of the same BCD digit to simultaneously have a binary 1 value. For example, note that the two most significant BCD bits C4, C8 and D4, D8 of BCD digits C and D, respectively, are included in the 12 inputs applied to PROM $P_5$. Since both of these two most significant BCD bits of the same BCD cannot simultaneously have a binary 1 value, the maximum sum possible for the two columns containing the 12 BCD bits to be added by PROM $P_5$ is 15 or 1111, which is within the maximum sum limit of requirement (2) above.

It will be understood that the same principles as exemplified above for choosing particular columns of BCD bit inputs of Table I of FIG. 2 for addition by PROM $P_5$ are also employed, wherever appropriate, for choosing the columns of BCD bits to be added by the other PROMs in the first logic level illustrated in FIG. 3 with the end result being that significantly less overall hardware is required as compared to that which would otherwise be necessary. Furthermore, this savings in hardware permits the logic provided by the first logic level 12 to economically be provided using a single level of PROMs operating in parallel and independently of each other, since there is no carry propagation required between the PROMs. Next to be considered is the specific manner in which each of PROMs $P_1$–$P_{12}$ in the first logic level 12 illustrated in FIG. 3 is individually programmed to provide for proper addition of the particular columns of BCD bits (including duplicates) applied thereto. For this purpose, attention is first directed to the following general equation which is used in determining the programming provided for a PROM in the first logic level 12 of the preferred embodiment of the invention being considered herein:

$$S = \sum_{k=1}^{n} W_k B_k \qquad (1)$$

where S is the binary sum provided by the PROM in response to the binary inputs applied thereto; n is the maximum number of inputs which the PROM is capable of receiving; $B_k = B_1$, $B_2$—$B_n$ identify the particular unique BCD inputs which are applied to the PROM; and $W_k = W_1$, $W_2$,—$W_n$ are the respective weighting values for the BCD inputs which the PROM has to be programmed to take into account in order for the PROM to provide the proper value of the sum S. Each weighting value is chosen to be representative of both column position as well as the presence of any duplicates. This is done by assigning power of 2 values (1, 2, 4, etc.) to the columns of BCD bits to be added by the PROM (as shown in FIG. 3) beginning with the least significant column of bits (rightmost column) and proceeding to the most significant column (leftmost column). Thus, the least significant column is assigned a 1 value, the next least significant column (on the left) is assigned a 2 value, the next least significant column is assigned a 4 value, and so on. Where no duplicate BCD bit is present, this column value is equal to the weighting value W in equation (1). Where there are duplicates, the weighting value W is obtained by adding together the column values of all duplicates.

Also, in order that there be no carry from the PROM, the sum S from each PROM must satisfy the equation:

$$S \leq 2^q - 1 \qquad (2)$$

where q is the number of individual binary outputs available from the PROM.

As pointed out previously, in the illustrative PROM arrangement for the first logic level 12 shown in FIG. 3, each PROM is typically a 256×4 bit PROM providing a maximum of 8 inputs and 4 outputs. Thus, n=8 in equation (1) above and q=4 in equation (2) above. Equations (1) and (2) thus become:

$$S = \sum_{k=1}^{8} W_k B_k \qquad (1A)$$

$$S = \leq 2^4 - 1 = 15 \text{ or } 1111 \qquad (2A)$$

In order to illustrate how equations (1A) and (2A) above are employed in implementing each PROM in FIG. 3, PROM $P_5$ will again be used as an example. Accordingly, it will be seen from FIG. 3 that the 8 unique BCD inputs applied to PROM $P_5$ are C2, C4, C8, D1, D2, D4, D8 and E1 contained in columns $b_7$ and $b_8$. Equation (1A) above may be expanded as follows when applied to PROM $P_5$:

$$S_5 = C2 + 3C4 + 2C8 + 3D1 + 3D2 + 3D4 + 2D8 + 2E1 \qquad (1B)$$

The weighting values for the BCD bits in the above equation (1B) for PROM $P_5$ are chosen as explained previously to take into account both column position and the presence of duplicates. More specifically, the weighting value for each of the duplicate BCD bits C4, D1, D2 and D4 is 3 in equation (1B) above, since each is present once in both of columns $b_7$ and $b_8$ in FIG. 3, the presence of the BCD bit in column $b_7$ contributing a 1 to the weighting value and the presence of the duplicate BCD bit in column $b_8$ contributing a 2 to the weighting value. With regard to the remaining unduplicated BCD bits, note that BCD bit C2 is present only in column $b_7$ and thus has a weighting value of 1 in equation (1B) while BCD bits C8, D8 and E1 are each present only in column $b_8$ so that each has a weighting value of 2 in equation (1B).

The manner in which equation (2A) above is advantageously met for PROM $P_5$ has already been considered previously herein and will not be repeated.

It should now be evident that a sum equation similar to equation (1B) above for PROM $P_5$ can also readily be provided in a like manner for each of the other PROMs in the first logic level 12 of FIG. 3, the particular sum equation for each PROM being set forth below.

PROM $P_1$: $S_1 = A2 + 2A4 + 4A8 + B1 + 2B2 + 4B4 + 2C1$
PROM $P_2$: $S_2 = B1 + 2B2 + 2B8 + C2 + 2C4 + 5D1 + 2D2 + 2E1$
PROM $P_3$: $S_3 = B4 + 2B8 + 3C1 + 2C2 + C8 + D4 + E2 + F1$
PROM $P_4$: $S_4 = D1 + D2 + D8 + E4 + 2E8 + F2 + G1$
PROM $P_5$: $S_5 = C2 + 3C4 + 2C8 + 3D1 + 3D2 + 3D4 + 2D8 + 2E1$
PROM $P_6$: $S_6 = 4D1 + F1 + 2F2 + F4 + 2F8 + 4G1 + G2 + 2G4$
PROM $P_7$: $S_7 = C8 + 3D2 + 3D4 + 3D8 + 3E1 + 3E2 + 2F2 + 2F8$
PROM $P_8$: $S_8 = 4E2 + 2E4 + 3F1 + F4 + 2G2 + G8$
PROM $P_9$: $S_9 = D4 + 3D8 + 3E4 + 3E8 + F2 + 3F4 + 6F8 + 2G8$
PROM $P_{10}$: $S_{10} = E4 + 2E8 + 3F1 + 2F2 + 2G1 + G2 + 2G4 + 4G8$
PROM $P_{11}$: $S_{11} = F2 + 3F4 + 6F8 + 3G1 + 3G2 + 2G4 + 4G8$
PROM $P_{12}$: $S_{12} = G1 + 3G2 + 7G4 + 14G8$

It will be understood that each of PROMs $P_1$–$P_{12}$ in FIG. 3 may be individually programmed by those skilled in the art to operate in conformance with its respective sum equation set forth above, so as to thereby provide an output sum which will correctly represent the sum of the particular columns of BCD bits designated to be added by the PROM as indicated in FIG. 3, even though the number of BCD bits to be added by a PROM may exceed the input capability of the PROM. Also, as described previously herein, in order to obtain the advantage of not having to be concerned with the production of a carry by the PROM, the sum is prevented from reaching a value which would produce a carry by judicious choice of the particular columns of BCD bits which are to be added by the PROM while additionally taking advantage, wherever possible, of the fact that a BCD digit cannot have a value greater than 9. Furthermore, it will be understood that the use of PROMs is well suited for implementing the preferred implementation shown in FIG. 3 because of the ease with which each PROM can be programmed to provide the individual programming required thereby in accordance with its respective sum equation set forth above without the need to change or add to the internal PROM hardware.

Figures 4, 5:
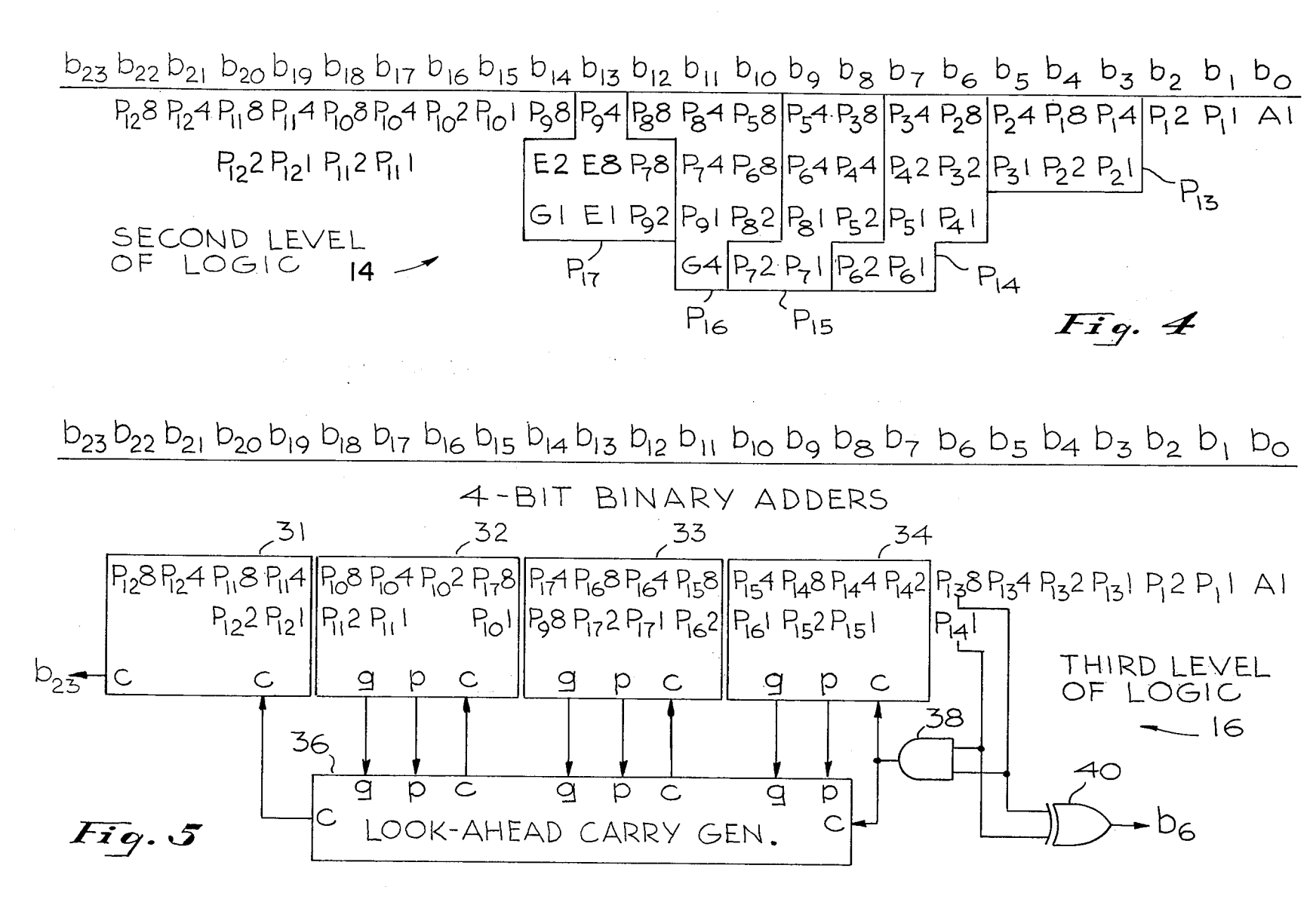

Next to be considered with reference to FIG. 4 is a preferred embodiment of the second logic level 14 shown generally in FIG. 1. It will be understood from the previous description of the preferred embodiment of the first logic level 12 shown in FIG. 3 that the PROM implementation illustrated provides for the addition of particular selected columns of BCD bits required by Table I in FIG. 2. The second logic level 14 provides for the addition of selected columns of bits provided at the output of the first logic level 12 so as to continue the progressive reduction of bits in columns $b_0$–$b_{23}$ of Table I begun by the first logic level 12, the output of the second logic level 14 being such that no more than 2 bits per column remain to be added at the output of the second logic level 14. For this purpose, the second logic level 14 also preferably employs a PROM implementation, the PROMs being designated in the preferred embodiment of FIG. 4 as PROMs $P_{13}$–$P_{17}$. It will be noted that, for easy comparison with FIGS. 2 and 3, FIG. 4 repeats the $b_0$–$b_{23}$ identifications. In this regard it will be remembered that each of $b_0$–$b_{23}$ represents a respective bit of the equivalent binary number to which the applied BCD number is being converted. It will also be remembered that the value of each of these bits $b_0$–$b_{23}$ is obtained by adding together all of the BCD bits in the corresponding column in Table 1 of FIG. 2, taking into account any carries from previous columns.

Now considering FIG. 4 in more detail, it is to be understood that it illustrates the remaining additions required to be performed in accordance with Table 1 of FIG. 2 as a result of the additions performed by the first logic level 12 of FIG. 3. Like FIG. 3, FIG. 4 employs a similar format to that of FIG. 3 with the particular columns of bits to be added by each of PROMs $P_{13}$–$P_{17}$ of FIG. 4 being those enclosed within the boundary line which represents each PROM. It is to be noted in FIG. 4 that bits A1, E1, E2, E8, G1 and G4 which were not applied to any of PROMs $P_1$–$P_{12}$ in FIG. 3 for addition are transposed unchanged to FIG. 4 in their proper column positions as shown. The 4-bit outputs representing the sums of the additions performed by PROMs $P_1$–$P_{12}$ of FIG. 3 are also transposed to FIG. 4 in their proper column positions. For purposes of identification, each of the four bits representing a PROM sum is indicated in FIG. 4 by the capital letter P having a subscript identifying its respective PROM followed by a power of 2 number (1, 2, 4 or 8) identifying the order of significance of the bit. For example, the four bits representing the sum $S_5$ from PROM $P_5$ in FIG. 3 are indicated in FIG. 4 by the designations P51, P52, P54 and P58 wherein P51 is the least significant bit.

It is also to be noted with respect to FIG. 4 that the same type of 256×4 bit PROM may also be used for each of PROMs $P_{13}$–$P_{17}$ as is used for each of PROMs $P_1$–$P_{12}$ in FIG. 3. It is further to be noted that, because of the very significant reductions in the numbers of bits in each column achieved by the PROM implementation of FIG. 3 for the particular choice of PROM size and example of BCD-to-binary conversion being considered herein for illustrative purposes, only the five PROMs $P_{13}$–$P_{17}$ are required in the second logic level 14 in order to achieve the desired progressive reduction of bits to be added in each column to no more than 2 bits per column. Thus, the particular illustrative PROM implementation shown in FIG. 4 did not need to take advantage of the feature of the invention employed in the PROM implementation of FIG. 3 which makes it possible for a greater number of bits to be added by a PROM than the PROM size would ordinarily dictate. However, in different circumstances (such as where a different PROM size is chosen and/or where different numbers of BCD digits are to be converted), there may be considerable advantage in also employing this feature in one or more subsequent levels as well as in the first level, and the invention is accordingly to be considered as encompassing such embodiments.

Although the PROM implementation of FIG. 4 need not provide for the addition of greater numbers of bits than the normal PROM input capable, it is still most advantageous in the preferred embodiment being considered herein that there be no carry from a PROM as explained previously. The particular bits chosen for application to each of PROMs $P_{13}$–$P_{17}$ in FIG. 4 are thus chosen to meet this requirement in the same manner as described in connection with the PROM implementation of FIG. 3.

Using the previously presented general equation (1) for the sum S and the same principles as employed for PROMs $P_1$–$P_{12}$ in FIG. 3, the following sum equation for each of PROMs $P_{13}$–$P_{17}$ in the particular implementation of FIG. 4 may be set forth as follows:

PROM $P_{13}$: $S_{13} = P_{14} + 2P_{18} + P_{21} + 2P_{22} + 4P_{24} + 4P_{31}$

PROM $P_{14}$: $S_{14} = P_{28} + P_{32} + 2P_{34} + P_{41} + 2P_{42} + 2P_{51} + 2P_{61} + 4P_{62}$

PROM $P_{15}$: $S_{15} = P_{38} + P_{44} + P_{52} + 2P_{54} + 2P_{64} + 2P_{71} + 4P_{72} + 2P_{81}$

PROM $P_{16}$: $S_{16} = 2G4 + P_{58} + P_{68} + 2P_{74} + P_{82} + 2P_{84} + 4P_{88} + 2P_{91}$

PROM $P_{17}$: $S_{17} = 2E1 + 4E2 + 2E8 + 4G1 + P_{78} + P_{92} + 2P_{94}$

As previously pointed out herein, with regard to the particular preferred embodiment considered herein, the second logic level 14 in FIG. 4 reduces the bits to be added in columns $b_0$–$b_{23}$ of Table I in FIG. 2 to no more than 2 bits per column, thereby permitting conventional adding and carry generating circuitry to be economically provided in the third logic level 16 of FIG. 1 without detracting from the high speed operation provided by the PROM implementations of the first and second logic levels 12 and 14. A preferred embodiment of the third logic level 16 will now be considered in detail with reference to FIG. 5.

It will be noted that the third logic level 16 illustrated in FIG. 5 employs a similar format to that of FIGS. 3 and 4 and, like FIG. 4, repeats the $b_0$–$b_{23}$ column designations of Table 1 in FIG. 2 so as to readily indicate, in their appropriate columns, the remaining additions to be performed by the third logic level 16 on the bits applied thereto from the second logic level. In this regard, it is to be noted that the 4 bit outputs from each of PROMs $P_{13}$–$P_{17}$ of the second logic level 14 of FIG. 2 are represented in the third logic level 16 shown in FIG. 5 in the same manner as the outputs of PROMs $P_1$–$P_{12}$ are represented in FIG. 4.

The preferred embodiment of the third logic level 16 shown in FIG. 5 will now be considered in more detail. It will be seen that the third logic level 16 typically comprises four 4-bit binary adders 31–34, a single look-ahead carry generator 36 operating in conjunction therewith, an AND gate 38, and an Exclusive OR gate 40. Each of adders 31–34 may, for example, be implemented using a Texas Instrument SN 74S181 integrated circuit chip, carry generator 36 may, for example, be implemented using a Texas Instrument SN 74S182 integrated circuit chip, and gates 38 and 40 may, for example, be implemented using Texas Instrument SN 74S08 and SN 74S86 integrated circuit chips, respectively. The particular columns of bits applied to each of adders 31–34 in FIG. 5 for addition thereby are shown within the block designating each adder. The bits applied to AND gate 38 and Exclusive OR gate 40 are indicated in a conventional manner. Also, it is to be noted that the lower case letters c, g and p in FIG. 5 respectively indicate carry, generate and propagate inputs and outputs in a conventional manner.

It will accordingly be understood from FIG. 5 that adders 31–34 serve to provide output bits $b_{23}$–$b_7$ of the equivalent binary number (output bit $b_{23}$ being the carry generated by adder 34), while AND gate 38 and Exclusive OR gate 40 serve to provide output bit $b_6$ as well as its carry to adder 34 and carry generator 36. As for the remaining output bits $b_0$–$b_5$ of the equivalent binary number, it will be understood from Table I in FIG. 2 in conjunction with FIGS. 3 and 4 that the least significant BCD bit A1 is equal to $b_0$ and thus propagates without change through the logic levels, that bits $b_1$ and $b_2$ are provided directly by PROM $P_1$ outputs $P_11$ and $P_12$, respectively, and that bits $b_3$, $b_4$ and $b_5$ are provided directly by PROM $P_{13}$ outputs $P_{13}1$, $P_{13}2$ and $P_{13}4$, respectively.

The following equations for bits $b_0$–$b_{23}$ of the equivalent binary number representing the logic performed by the third logic level of FIG. 5 may be set forth as follows wherein a carry is represented by the lower case letter "c" having a subscript indicating the column to which it corresponds:

| | |
|---|---|
| $b_0 = A1$ | $b_{12} = P_{16}4 + P_{17}1 + c_{11}$ |
| $b_1 = P_11$ | $b_{13} = P_{16}8 + P_{17}2 + c_{12}$ |
| $b_2 = P_12$ | $b_{14} = P_{17}4 + P_98 + c_{13}$ |
| $b_3 = P_{13}1$ | $b_{15} = P_{17}8 + P_{10}1 + c_{14}$ |
| $b_4 = P_{13}2$ | $b_{16} = P_{10}2 + c_{15}$ |
| $b_5 = P_{13}4$ | $b_{17} = P_{10}4 + P_{11}1 + c_{16}$ |
| $b_6 = P_{13}8 + P_{14}1$ | $b_{18} = P_{10}8 + P_{11}2 + c_{17}$ |
| $b_7 = P_{14}2 + c_6$ | $b_{19} = P_{11}4 + P_{12}1 + c_{18}$ |
| $b_8 = P_{14}4 + P_{15}1 + c_7$ | $b_{20} = P_{11}8 + P_{12}2 + c_{19}$ |
| $b_9 = P_{14}8 + P_{15}2 + c_8$ | $b_{21} = P_{12}4 + c_{20}$ |
| $b_{10} = P_{15}4 + P_{16}1 + c_9$ | $b_{22} = P_{12}8 + c_{21}$ |
| $b_{11} = P_{15}8 + P_{16}2 + c_{10}$ | $b_{23} = c_{22}$ |

It is to be understood that the present invention is subject to a wide variety of modifications and variations in construction, arrangement and use without departing from the scope of this invention. Accordingly, the present invention is to be considered as including all possible modifications and variations coming within the scope of the invention as defined by the appended claims.

What is claimed is:

1. Apparatus for converting a plurality of BCD binary input signals representing the BCD digits of a decimal number into a plurality of equivalent binary signals representing the decimal number in true binary form, said apparatus comprising:

binary adder means to which said BCD binary input signals are applied for conversion into said equivalent binary signals;

said binary adder means being connected to said BCD binary input signals so as to provide for addition thereof in a columnar arrangement corresponding to a powers of 2 expansion of the BCD digits of said decimal number;

said binary adder means comprising:

a first level of logic circuitry including a plurality of individually programmed PROMs;

each PROM of said first level being programmed to provide PROM output binary signals representing the addition of a predetermined plurality of said BCD binary input signals taking into account their column locations;

each PROM of said first level being of a size such that no carry is generated therefrom in response to the addition performed on the BCD binary input signals applied thereto; and a second level of logic circuitry to which output binary signals from said first level are applied, said second level including a plurality of individually programmed PROMs;

each PROM of said second level being programmed to provide PROM output binary signals in response to a predetermined plurality of binary signals applied thereto chosen from the PROM output binary signals provided by said first level and any not yet added BCD binary input signals;

each PROM of said second level being of a size such that no carry is generated therefrom in response to the addition performed on the binary signals applied thereto.

2. The invention in accordance with claim 1, wherein said adder includes additional logic circuitry to which is applied any BCD binary input signals and PROM output binary signals of said first and second levels remaining to be added in each column, said additional logic circuitry being operative to provide the final additions required for the columns of BCD binary input signals.

3. The invention in accordance with claim 1, wherein at least one additional level of logic circuitry and a final level of logic circuitry are also provided, and wherein said levels of logic operate to progressively reduce the bits in said columns so that no more than two bits per column remain to be added by said final level of logic circuitry.

4. The invention in accordance with claims 1, 2 or 3, wherein the particular binary signals applied to at least one PROM and the programming thereof are chosen so as to provide for the addition of more binary signals than the maximum number of PROM inputs available.

5. The invention in accordance with claim 4, wherein the binary signals applied to said at least one PROM are chosen so that the number of unique binary signals is no greater than the maximum number of PROM inputs available, the remaining binary signals being duplicates, wherein these unique binary signals are applied as PROM inputs, and wherein the programming of said at least one PROM is chosen so that the addition provided thereby takes into account the presence of any duplicates of said unique inputs as well as their locations in said columns.

6. The invention in accordance with claim 5, wherein said at least one PROM is programmed in accordance with the following equation:

$$S = \sum_{k=1}^{n} W_k B_k$$

where S is the binary sum provided at the output of said at least one PROM, n is the maximum number of available PROM inputs, $B_k = B_1$, $B_2$-$B_n$ identify the unique binary signals (any additional binary signals being duplicates), and $W_k = W_1$, $W_2$-$W_n$ are weighting values, each weighting value being chosen to have a value which takes into account the presence of its respective unique binary signal and column location as well as the presence of each duplicate and its respective column location.

7. Apparatus for converting a plurality of BCD binary input signals representing the BCD digits of a decimal number into a plurality of equivalent binary signals representing the decimal number in true binary form, said apparatus comprising:

binary adder means to which said BCD binary input signals are applied for conversion into said equivalent binary signals;

said binary adder means being connected to said BCD binary input signals so as to provide for addition thereof in a columnar arrangement corresponding to a powers of 2 expansion of the BCD digits of said decimal number;

said binary adder means comprising:

at least one level of logic including a plurality of individually programmed PROMs;

each PROM being programmed to provide PROM output binary signals representing the addition of a predetermined plurality of said BCD binary input signals; and at least one PROM having its input binary signals and programming chosen so as to provide for the addition of more binary signals than the maximum number of PROM inputs available.

8. The invention in accordance with claim 7, wherein the particular binary signals applied to said at least one PROM are chosen so that the number of unique binary signals is no greater than the maximum number of PROM inputs available, the remaining binary signals being duplicates, wherein these unique binary signals are applied as PROM inputs, and wherein the programming of said at least one PROM is chosen so that the addition provided thereby takes into account the presence of any duplicates of said unique binary signals as well as their column locations.

9. The invention in accordance with claim 8, wherein said at least one PROM is programmed in accordance with the following equation:

$$S = \sum_{k=1}^{n} W_k B_k$$

where S is the binary sum provided at the output of said at least one PROM, n is the maximum number of available PROM inputs, $B_k = B_1$, $B_2$-$B_n$ identify the unique binary signals (any additional PROM input binary signals being duplicates), and $W_k = W_1$, $W_2$-$W_n$ are weighting values, each weighting value being chosen to have a value which takes into account the presence of its respective unique binary signal and column location as well as the presence of each duplicate and its respective column location.

10. The invention in accordance with claim 7, 8, or 9, wherein each PROM is of a size such that no carry is generated therefrom in response to the addition performed on the binary signals applied thereto.

11. The invention in accordance with claim 10, wherein each PROM is chosen in accordance with the following equation in order to prevent a carry from being generated therefrom:

$$S \leq 2^q - 1$$

where S is the sum represented by the PROM output binary signals and q is the number of individual binary outputs available from the PROM.

12. The invention in accordance with claim 1, 2, 3, 7, 8 or 9, wherein the choice of the size of each PROM in order to prevent a carry from being generated therefrom takes into account that a BCD digit cannot exceed a value of 9.

* * * * *